United States Patent
Satomura et al.

[11] Patent Number: 6,043,423
[45] Date of Patent: Mar. 28, 2000

[54] THERMOELECTRIC DEVICE AND THERMOELECTRIC MODULE

[75] Inventors: Masafumi Satomura, Nara-Ken; Ichiro Yamasaki, Yamatotakada; Ryousuke Yamanaka, Nara-Ken, all of Japan

[73] Assignee: Sharp Kabushiki Kaisha, Osaka, Japan

[21] Appl. No.: 09/063,357

[22] Filed: Apr. 21, 1998

[30] Foreign Application Priority Data

Apr. 28, 1997 [JP] Japan .................................. 9-111557

[51] Int. Cl.$^7$ .................................................. H01L 35/28
[52] U.S. Cl. ........................ 136/211; 136/203; 136/205; 136/212
[58] Field of Search .................................. 136/200, 201, 136/203, 205, 212, 211

[56] References Cited

FOREIGN PATENT DOCUMENTS

| 62-177985 | 8/1987 | Japan . |  |
|---|---|---|---|
| 62-249490 | 10/1987 | Japan | ................................... 136/200 |
| 2-214175 | 8/1990 | Japan . |  |
| 4-151882 | 5/1992 | Japan . |  |
| 6-13664 | 1/1994 | Japan . |  |
| 6-188464 | 7/1994 | Japan . |  |
| 6-318736 | 11/1994 | Japan . |  |
| 7-35618 | 2/1995 | Japan . |  |
| 8-32126 | 2/1996 | Japan . |  |

OTHER PUBLICATIONS

Kim, Il–Ho et al, Preparation and Properties of (Bi,Sb)2(Te, Se)3 Thin Film Thermoelectric Modules, pp 328–333, No month and year given.

*Primary Examiner*—Kathryn Gorgos
*Assistant Examiner*—Thomas H Parsons

[57] ABSTRACT

On a top surface of a substrate, a first and a second electrode are formed. A p-type semiconductor film is formed over substantially the entire exposed area on the top surface of the substrate and over the first electrode. An n-type semiconductor film is also formed over substantially the entire surface, but does not cover the first electrode, the p-type semiconductor film and the second electrode. A junction surface between the p-type and n-type semiconductor films extends over substantially the entire substrate, thereby providing a thermoelectric device which can cool or heat a wide surface area. The inclusion of the junction surface between p-type and n-type films, which extends over substantially the entire surface of the substrate, provides a unit whose top surface serves as a heat-absorbing portion and whose bottom surface serves as a heat-releasing portion. Further, by laying a plurality of such units one over the other with insulating material between them, a cascade-type thermoelectric module is obtained.

16 Claims, 9 Drawing Sheets

■ p-type

□ n-type

▨ copper

THERMOELECTRIC DEVICE AND THERMOELECTRIC MODULE

BACKGROUND OF THE INVENTION

1. Field of the Invention

The present invention relates to a thermoelectric device and a thermoelectric module that use thermoelectric material in the form of films to convert heat into electricity and vice versa.

2. Description of the Prior Art

A conventional thermoelectric device that is already in practical use is composed of p-type and n-type bulk thermoelectric materials arranged on a substrate, and these materials are connected alternately such that they are connected in series electrically. Such a bulk thermoelectric device is shaped like a flat plate, and has a low-temperature region formed on one of its top and bottom surfaces and a high-temperature region formed on the other.

By use of this bulk thermoelectric device, it is possible to cool an object by keeping a surface of the object in close contact with the low-temperature region of the device. Conversely, by producing a temperature difference between the top and bottom surfaces of the device, it is possible to obtain electric power. In this way, a thermoelectric device is used in thermoelectric cooling and heating for the purpose of cooling and heating various objects, as well as in thermoelectric power generation for the purpose of obtaining electricity from a heat source such as waste heat.

To make as efficient use of resources as possible and to achieve as great a cost reduction as possible, a modified type of thermoelectric device has been proposed that uses thermoelectric material in the form of films. For example, Japanese Laid-open Patent Application No. H8-32126 proposes a thermoelectric device composed of p-type and n-type semiconductor films that do not overlap one another and that are connected together by films of copper (Cu) laminated over them. On the other hand, Il-Ho Kim and Dong-Hi Lee propose, in Proc. 12th ICTEC, 1993, p. 328, a thermoelectric device that is composed of p-type semiconductor films, n-type semiconductor films, and Cu films and in which these films do not overlap one another. In this device, as shown in FIG. 9, the p-type semiconductor films 2 and the n-type semiconductor films 3, both made of thermoelectric material, are arranged on a substrate so as to form a radiating pattern, and these films are connected alternately by the Cu films 17 such that they are connected in series electrically.

This device has many junctions between the p-type semiconductor films 2, the n-type semiconductor films 3, and the Cu films 17. When the device receives a positive voltage and a negative voltage at its electrode films 18a and 18b, respectively, heat is absorbed at the junctions on the positive side of the p-type semiconductor films 2 (on the negative side of the n-type semiconductor films 3), whereas heat is released at the junctions on the negative side of the p-type semiconductor films 2 (on the positive side of the n-type semiconductor films 3). Accordingly, when the device is so energized that an electric current flows clockwise through the pattern shown in FIG. 9, heat is absorbed at the junctions between the p-type semiconductor films 2 and the n-type semiconductor films 3 (these junctions are placed near the center of the pattern), whereas heat is released at the junctions between the p-type semiconductor films 2 and the Cu films 17 and at the junctions between the n-type semiconductor films 3 and the Cu films 17 (these junctions are placed away from the center of the pattern).

A thermoelectric module is produced by covering the top surface of this thermoelectric device with electrical insulating material such as a high-polymer film or ceramic sheet. When such a thermoelectric module is energized, for example, in the manner as described above, the central part of the insulating material is cooled and a low-temperature region appears there, whereas the peripheral part of the insulating material is heated and a high-temperature region appears there. Thus, it is possible to cool an object, for example, by placing it in close contact with the low-temperature region of the insulating material. Conversely, by producing a temperature difference between the central and peripheral parts of the insulating material, it is possible to extract electricity between the electrode films 18a and 18b, that is, to generate electric power.

However, in the thermoelectric module composed of films of thermoelectric material as shown in FIG. 9, the heat-absorbing portion and the heat-releasing portion are both formed on a single plane. Therefore, it is not possible to construct, on this principle, a cascade-type thermoelectric module that is shaped like a flat plate and has a low-temperature region formed on one of its top and bottom surfaces and a high-temperature region formed on the other. Moreover, the thermoelectric module shown in FIG. 9, unlike the bulk thermoelectric device mentioned earlier, cannot cool or heat a wide-area surface uniformly, and thus its uses are limited.

Similarly, the thermoelectric device proposed in Japanese Laid-open Patent Application No. H8-32126 has many heat-absorbing and heat-releasing portions formed on a single plane, and, in addition, these heat-absorbing and heat-releasing portions are formed alternately along a straight line. As a result, this thermoelectric device cannot be used to selectively cool or heat an object, and thus its uses are limited mostly to power generation applications. Moreover, since the heat-absorbing and heat-releasing portions are placed close to one another, this thermoelectric device suffers from a heavy loss of heat through heat conduction and thus from poor thermoelectric conversion efficiency.

SUMMARY OF THE INVENTION

An object of the present invention is to provide a thermoelectric device that uses thermoelectric material in the form of films and that can cool or heat a wide-area surface uniformly with a minimal loss of heat.

Another object of the present invention is to provide a cascade-type thermoelectric module that uses thermoelectric material in the form of films and that provides a large temperature difference between its low-temperature and high-temperature regions.

To achieve the above objects, according to one aspect of the present invention, in a thermoelectric device composed of a p-type semiconductor film and an n-type semiconductor film formed on a surface of a substrate of electrical insulating material, substantially the entire surface of the substrate is covered by the p-type and n-type semiconductor films. This makes it possible to form heat-absorbing and heat-releasing areas over substantially the entire surface of the substrate and thus to cool or heat a wide area. The p-type and n-type semiconductor films may be either joined together or left separated.

When the p-type and n-type semiconductor films are joined together, the junction surface between them is so formed as to extend over substantially the entire surface of the substrate. In this case, the junction surface may be made to extend uniformly or non-uniformly. A junction surface that extends uniformly over substantially the entire surface of the substrate can be obtained by first forming one film over substantially the entire surface of the substrate without any gap and then forming on top of it the other film of approximately the same size with a slight shift in position and without any gap. On the other hand, a junction surface that extends non-uniformly over substantially the entire surface of the substrate can be obtained by first forming one film with gaps so as to be distributed over substantially the entire surface of the substrate and then forming on top of it the other film. In either construction, the resulting thermoelectric device has as its heat-absorbing or heat-releasing area a junction surface that extends over a wide area. The junction surface, when formed non-uniformly, may be shaped in any manner; for example, it may be shaped like a strip that has substantially parallel sides, or may be divided into discrete portions.

When the p-type and n-type semiconductor films are left separated, they are connected by a conductive film that is formed on their surfaces. In this case, the surface of contact between each semiconductor film and the conductive film serves as a heat-absorbing or heat-releasing area. This conductive film may be discontinuous.

It is also possible to shape both the p-type and n-type semiconductor films so as to have a plurality of strip-like portions that are substantially parallel to one another so that the strip-like portions of the p-type semiconductor film and the strip-like portions of the n-type semiconductor film are formed alternately on the substrate. By forming the strip-like portions of the two semiconductor films with overlaps, it is possible to easily realize a construction that has a non-uniform junction surface extending over substantially the entire surface of the substrate. Even when the strip-like portions of the two semiconductor films are formed without overlaps, it is easy to connect the two semiconductor films with a conductive film.

Electrodes are formed as follows. A first electrode is formed in an area within the surface of the substrate where the n-type semiconductor film is not formed, and a second electrode is formed in an area within the surface of the substrate where the p-type semiconductor film is not formed. The p-type semiconductor film is placed in contact with the surface of the first electrode, and the n-type semiconductor film is placed in contact with the surface of the second electrode. The heat-absorbing or heat-releasing action that takes place at the contact between the p-type semiconductor film and the first electrode and at the contact between the n-type semiconductor film and the second electrode is opposite to the action which takes place in the other area on the surface of the substrate. Accordingly, forming the electrodes as described above helps minimize the areas that cause the opposite action to the action taking place over substantially the entire surface of the substrate. In addition, such formation of electrodes makes the thermoelectric device easier to manufacture. It is preferable that the first and second electrodes be formed in a peripheral area on the substrate.

It is also possible to divide the p-type and n-type semiconductor films each into a plurality of discrete portions. In this case, all the portions of the p-type semiconductor film are placed in contact with the first electrode such that the former are electrically connected in parallel to the latter, and all the portions of the n-type semiconductor film are placed in contact with the second electrode such that the former are electrically connected in parallel to the latter.

It is also possible to form the p-type and n-type semiconductor films both on a top surface and on a bottom surface of the substrate, and connect either the p-type or n-type semiconductor film on the top surface to the corresponding semiconductor film on the bottom surface by conductive material. When a voltage is applied between the semiconductor film on the top surface and the semiconductor film on the bottom surface that are not connected by the conductive material, a voltage of one polarity is applied between the p-type and n-type semiconductor films on the top surface, and a voltage of the opposite polarity is applied between the p-type and n-type semiconductor films on the bottom surface. Thus, it is possible to obtain a thermoelectric device that absorbs heat on one side and releases heat on the other side.

It is also possible to form through holes in the substrate and, from the top surface of the substrate to the bottom surface thereof through these through holes, form the conductive material for connecting the semiconductor films on the top and bottom surfaces. When the substrate is made of highly heat-insulating resin, it is possible to suppress heat conduction between the top and bottom surfaces and thereby enhance cooling, heating, and power generating efficiency.

According to another aspect of the present invention, a thermoelectric module is produced by laying a plurality of thermoelectric devices, each constructed as described above so as to have a p-type semiconductor film and an n-type semiconductor film on both the top and bottom surfaces of a substrate, over one another with electrical insulating material between them and with the n-type or p-type semiconductor films that are not connected by the conductive film in the individual thermoelectric devices connected together by conductive material. By laying a plurality of thermoelectric devices that absorb heat on one side and release heat on the other side over one another and connecting them in series electrically, it is possible to obtain a cascade-type thermoelectric module that provides a large temperature difference between its low-temperature and high-temperature regions.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1A:
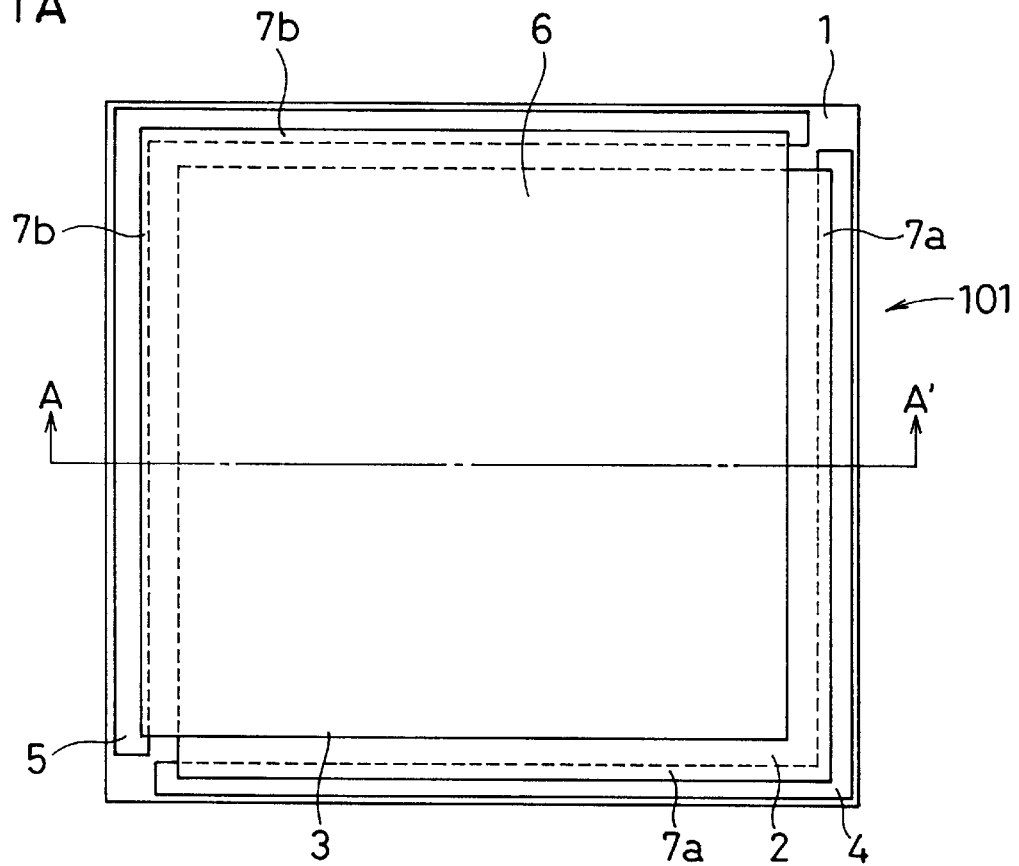
FIG. 1A is a plan view of the thermoelectric device of a first embodiment of the invention.
Figure 1B:
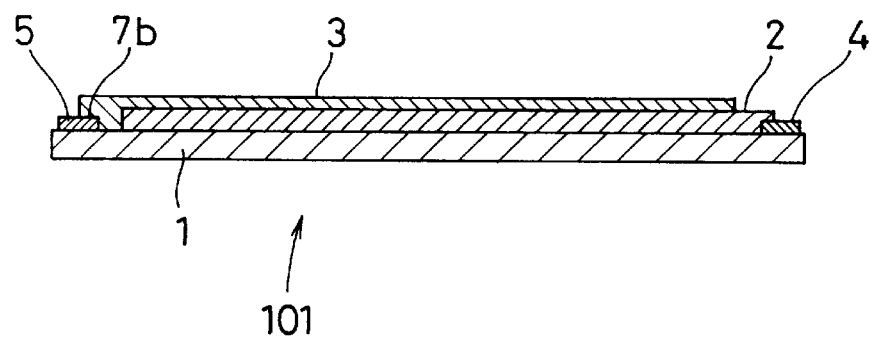
FIG. 1B is a section of the thermoelectric device of the first embodiment along line A-A' in FIG. 1A.

Hereinafter, embodiments of the present invention will be described with reference to the drawings. First, a first embodiment will be described. FIG. 1A is a plan view of the thermoelectric device 101 of the first embodiment, and FIG. 1B is a section of this thermoelectric device 101 along line A-A' in FIG. 1A. Numeral 1 represents a substrate made of electrical insulating material such as glass or high-polymer film.

The substrate 1 has a first electrode 4 and a second electrode 5, both L-shaped, formed on its top surface along its side edges. The first and second electrodes 4 and 5 are made of metal such as aluminum, silver, or gold, and formed through vacuum evaporation, sputtering, or vacuum film deposition such as CVD (chemical-vapor deposition).

Numeral 2 represents a p-type semiconductor film made of material that provides high thermoelectric conversion efficiency (for example $Bi_xSb_{2-x}Te_3$). This film is patterned in a substantially square shape, and is connected at two adjacent side edges to the first electrode 4. Appropriate masking is applied, however, to prevent this film from covering the second electrode 5.

Numeral 3 represents an n-type semiconductor film made of material that provides high thermoelectric conversion efficiency (for example $Bi_2Se_xTe_{3-x}$). This film, too, is, like the p-type semiconductor film 2, patterned in a substantially square shape. This film is so formed as to be kept in close contact with the top surface of the p-type semiconductor film 2, and is connected at two adjacent side edges to the second electrode 5. Appropriate masking is applied, however, to prevent this film from covering the first electrode 4 as well as the junction 7a between the p-type semiconductor film 2 and the first electrode 4.

When a direct-current voltage is applied across the thermoelectric device 101, with the first electrode 4 negative and the second electrode 5 positive, an electric current flows from the second electrode 5 through the n-type semiconductor film 3 and then the p-type semiconductor film 2 to the first electrode 4. At this time, heat is absorbed at the junction surface 6 between the p-type semiconductor film 2 and the n-type semiconductor film 3, because this junction surface is situated on the positive side of the p-type semiconductor (i.e. on the negative side of the n-type semiconductor).

On the other hand, heat is released at the junction surface 7a between the p-type semiconductor film 2 and the first electrode 4 and at the junction 7b between the n-type semiconductor film 3 and the second electrode 5, because these junction surfaces are situated respectively on the negative side of the p-type semiconductor and on the positive side of the n-type semiconductor. Thus, the areas near the side edges of the substrate 1 serve as heat-releasing portions 7a and 7b, and substantially the entire surface of the substrate 1 excluding those side-edge areas serves as a heat-absorbing portion 6.

In the thermoelectric device 101 of this embodiment, the heat-absorbing portion 6 is made larger than the heat-releasing portions 7a and 7b, and is formed over substantially the entire surface of the substrate 1. As a result, the substrate 1 as a whole provides heat-absorbing action. Thus, its heat-absorbing portion 6 can be used to cool a wide-area object. Note that, when the gaps between the heat-absorbing portion 6 and the heat-releasing portions 7a and 7b are too narrow, too much heat is lost through heat conduction through the substrate 1 and the semiconductor films 2 and 3, with the result that the thermoelectric conversion efficiency drops. Accordingly, it is preferable to arrange the heat-absorbing portion 6 and the heat-releasing portions 7a and 7b with adequate gaps between them.

Although the electric current is passed from the second electrode 5 to the first electrode 4 in this embodiment, it is also possible to pass the current in the reverse direction; this causes the junction surface 6 to serve as the heat-releasing portion and the junction surfaces 7a and 7b to serve as the heat-absorbing portions. Moreover, by producing a temperature difference between the junction surface 6 and the junction surfaces 7a and 7b, it is also possible to generate electric power.

Figure 2A:
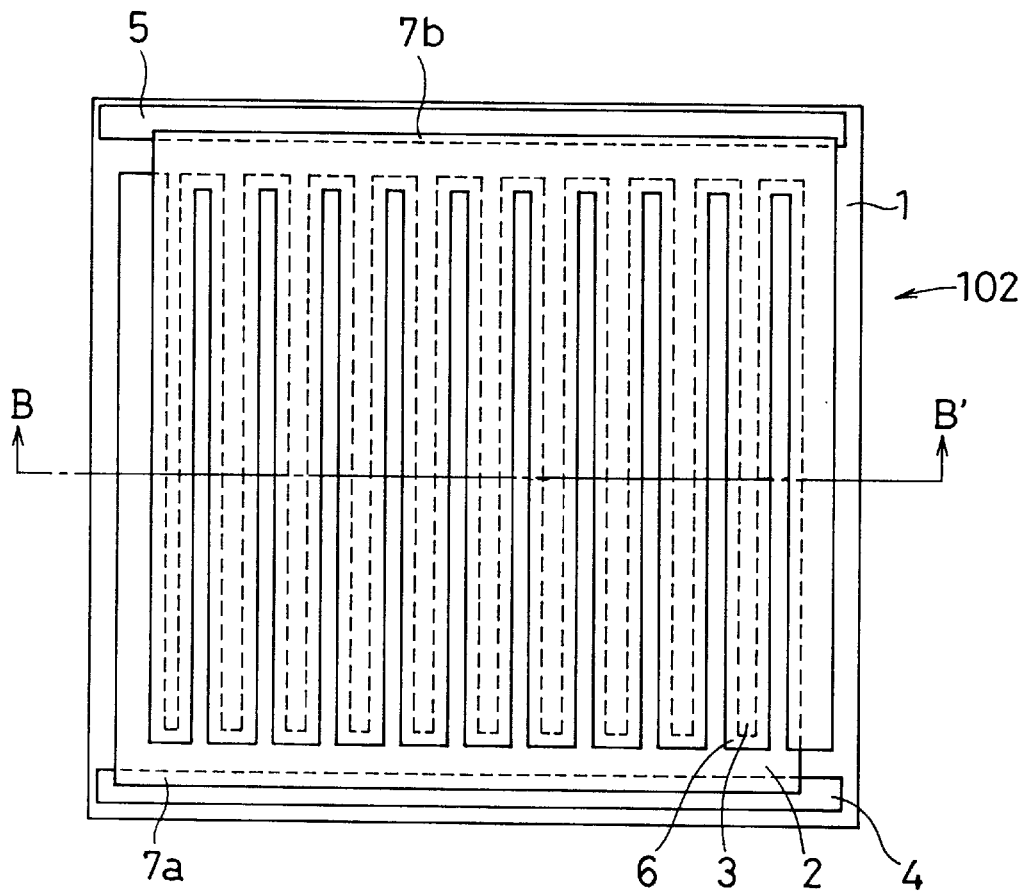
FIG. 2A is a plan view of the thermoelectric device of a second embodiment of the invention.
Figure 2B:
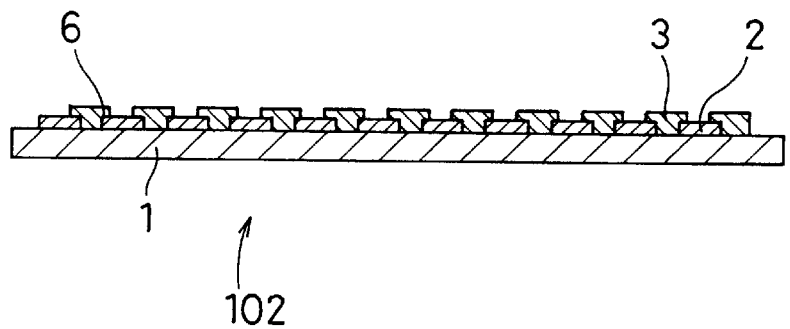
FIG. 2B is a section of the thermoelectric device of the second embodiment along line B-B' in FIG. 2A.

Next, a second embodiment will be described. FIG. 2A is a plan view of the thermoelectric device 102 of the second embodiment, and FIG. 2B is a section of this thermoelectric device 102 along line B-B' in FIG. 2A. In this embodiment, the substrate 1, the semiconductor films 2 and 3, and the electrodes 4 and 5 are made of the same materials and formed in the same manners as in the first embodiment.

On the top surface of the substrate 1, the first electrode 4 and the second electrode 5, both I-shaped, are formed along opposite side edges of the substrate 1. The p-type semiconductor film 2 and the n-type semiconductor film 3 are both patterned in a comb-like shape. The p-type semiconductor film 2 is, along its comb-back portion, connected to the top surface of the first electrode 4, and is placed apart from the second electrode 5.

The n-type semiconductor film 3, too, is, at its comb-back portion, connected to the top surface of the second electrode 5, and is placed apart from the first electrode 4. The comb-tooth portions of the n-type semiconductor film 3 are formed between the comb-tooth portions of the p-type semiconductor film 2, and the former are joined from above to those parts of the latter that adjoin them on both sides. As a result, a long, narrow junction surface 6 is formed over the entire surface of the substrate 1.

When a direct-current voltage is applied across the thermoelectric device 102, with the first electrode 4 negative and the second electrode 5 positive, an electric current flows from the second electrode 5 through the n-type semiconductor film 3 and then the p-type semiconductor film 2 to the first electrode 4. At this time, heat is absorbed at the junction surface 6 between the p-type semiconductor film 2 and the n-type semiconductor film 3, because this junction surface is situated on the positive side of the p-type semiconductor (i.e. on the negative side of the n-type semiconductor).

On the other hand, heat is released at the junction surface 7a between the p-type semiconductor film 2 and the first electrode 4 and at the junction surface 7b between the n-type semiconductor film 3 and the second electrode 5, because these junction surfaces are situated respectively on the negative side of the p-type semiconductor and on the positive side of the n-type semiconductor. Thus, the areas near opposite side edges of the substrate 1 serve as heat-releasing portions 7a and 7b, and substantially the entire surface of the substrate 1 excluding those side-edge areas serves as a heat-absorbing portion 6.

In the thermoelectric device 102 of this embodiment, as in the first embodiment, the heat-absorbing portion 6 is made larger than the heat-releasing portions 7a and 7b, and is formed over substantially the entire surface of the substrate 1. As a result, the substrate 1 as a whole provides heat-absorbing action. Note that, although the semiconductor films 2 and 3 are formed in a comb-like shape here, they may be shaped in any manner as long as the junction surface 6 is formed over substantially the entire substrate 1.

Figure 3:
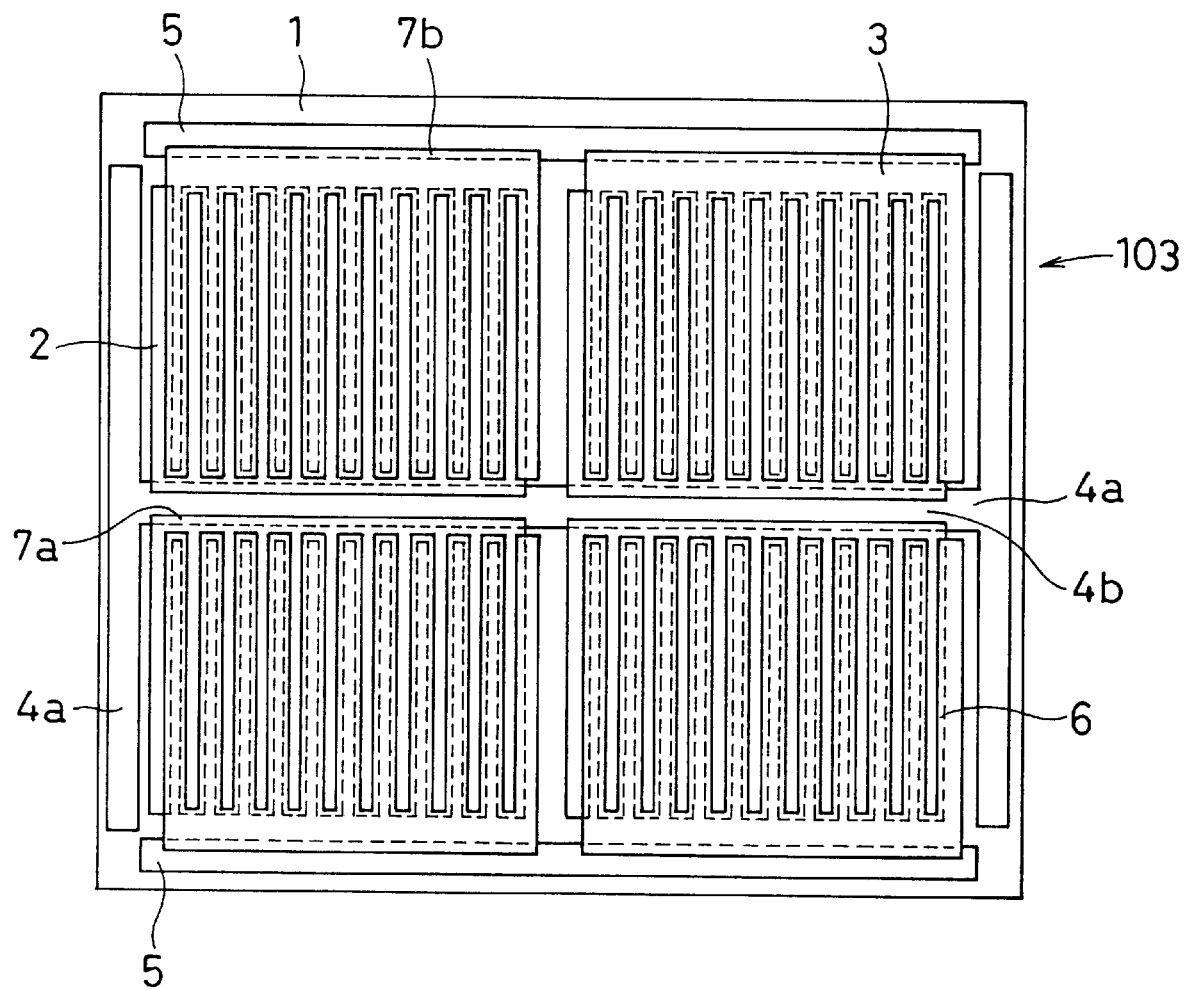
FIG. 3 is a plan view of the thermoelectric device of a third embodiment of the invention.

Next, a third embodiment will be described. FIG. 3 is a plan view of the thermoelectric device 103 of the third embodiment. This thermoelectric device 103 is obtained by modifying the second embodiment so that it includes four of the semiconductor films 2 and 3 each. More specifically, on the top surface of the substrate 1, the second electrode 5 is formed as two I-shaped portions along two opposite side edges of the substrate 1. On the other hand, the first electrode 4a and 4b, which is H-shaped as a whole, consists of two portions 4a along the other two opposite side edges of the substrate 1 where the second electrode 5 is not formed and a portion 4b parallel to the second electrode 5 for connecting those two side-edge portions 4a.

On the substrate 1, four p-type semiconductor films 2 and four n-type semiconductor films 3 are formed, with each film patterned in a comb-like shape. The p-type semiconductor films 2 are, along their comb-back portions, connected to two side edges of the first electrode 4b, with two films on each side, so that their comb-tooth portions point upward (in two of them) and downward (in the other two) in the figure (i.e. these portions face the second electrode 5).

The n-type semiconductor films 3 are, along their comb-back portions, connected to the two portions of the second electrode 5, with two films on each portion, so that their comb-tooth portions face the first electrode 4b. These p-type and n-type semiconductor films 2 and 3 are, as in the second embodiment, joined together at their comb-tooth portions. As a result, four long, narrow junction surfaces 6 are formed over the entire surface of the substrate 1.

When a direct-current voltage is applied across the thermoelectric device 103, with the first electrode 4a and 4b negative and the second electrode 5 positive, an electric current flows from the second electrode 5 through the n-type semiconductor films 3 and then the p-type semiconductor films 2 to the first electrode 4a and 4b. At this time, heat is absorbed at the junction surfaces 6 between the p-type semiconductor films 2 and the n-type semiconductor films 3, because these junction surfaces are situated on the positive side of the p-type semiconductor (i.e. on the negative side of the n-type semiconductor).

On the other hand, heat is released at the junction surfaces 7a between the p-type semiconductor films 2 and the first electrode 4a and 4b and at the junction surfaces 7b between the n-type semiconductor films 3 and the second electrode 5, because these junction surfaces are situated respectively on the negative side of the p-type semiconductor and on the positive side of the n-type semiconductor. Thus, in the figure, the areas near the upper and lower side edges of the substrate 1 and the area in the middle of them serve as heat-releasing portions 7a and 7b, and substantially the entire surface of the substrate 1 excluding the just-mentioned areas serves as a heat-absorbing portion 6. As a result, in the thermoelectric device 103 of this embodiment, as in the second embodiment, the substrate 1 as a whole provides heat-absorbing action.

Figure 4A:
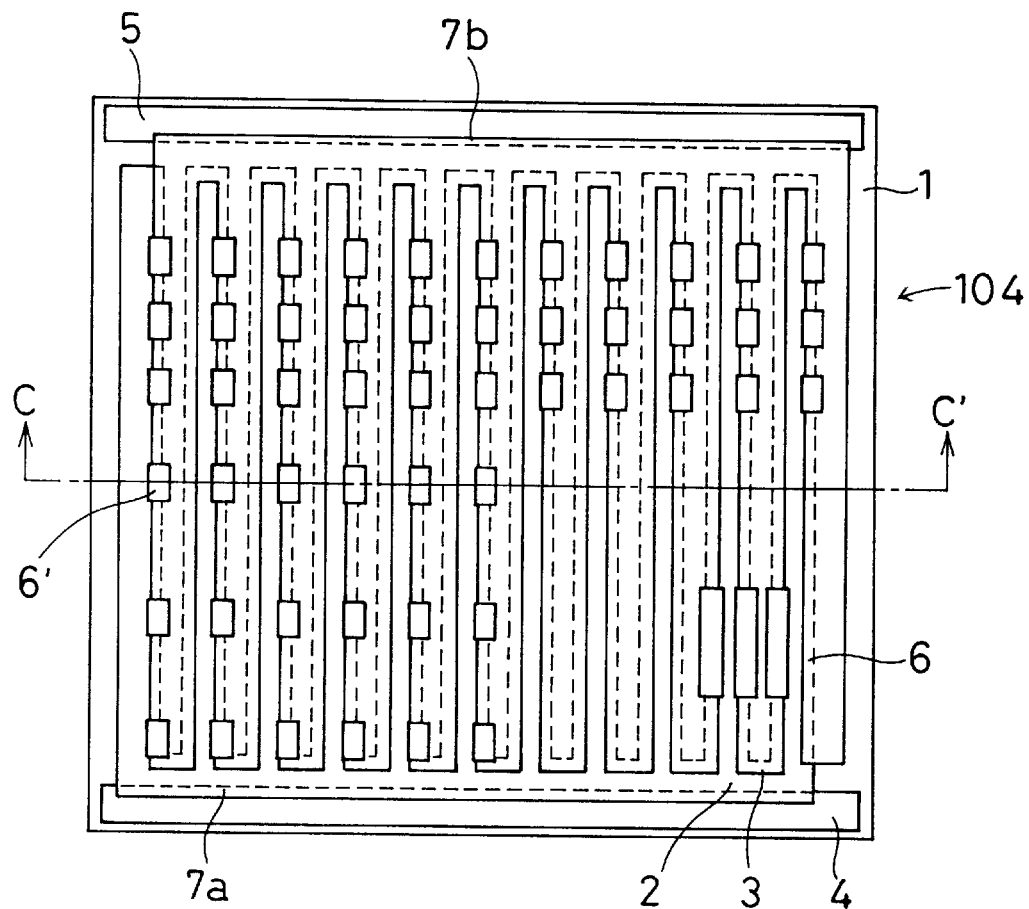
FIG. 4A is a plan view of the thermoelectric device of a fourth embodiment of the invention.
Figure 4B:
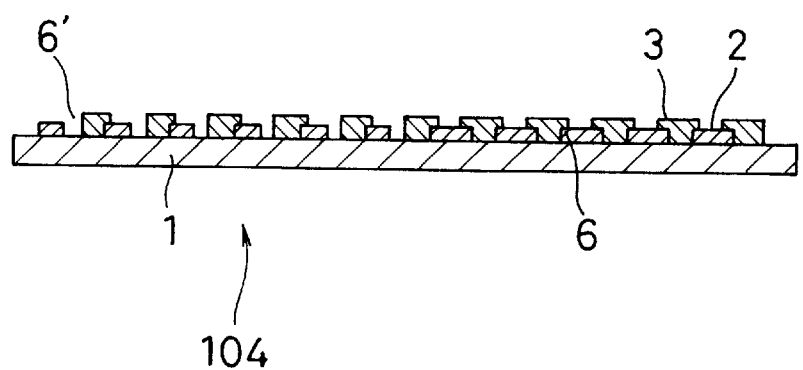
FIG. 4B is a section of the thermoelectric device of the fourth embodiment along line C-C' in FIG. 4A.

Next, a fourth embodiment will be described. FIG. 4A is a plan view of the thermoelectric device 104 of the fourth embodiment, and FIG. 4B is a section of this thermoelectric device 104 along line C-C' in FIG. 4A. In this embodiment, the substrate 1 and the electrodes 4 and 5 are constructed in the same manners as in the second embodiment. Specifically, on the top surface of the substrate 1, the first electrode 4 and the second electrode 5, both I-shaped, are formed along opposite side edges of the substrate 1.

The semiconductor films 2 and 3 are, as in the second embodiment, patterned in a comb-like shape, and connected respectively to the first and second electrodes 4 and 5. In this embodiment, however, these semiconductor films 2 and 3 have, at their comb-tooth portions, a number of discrete areas where no film exist. As a result, the junction surface 6, which is formed by joining these p-type and n-type semiconductor films 2 and 3 at their comb-tooth portions, has a number of discrete areas 6' where no junction exists.

When a direct-current voltage is applied across the thermoelectric device 104, with the first electrode 4 negative and the second electrode 5 positive, an electric current flows from the second electrode 5 through the n-type semiconductor film 3 and then the p-type semiconductor film 2 to the first electrode 4. At this time, heat is absorbed at the junction surface 6 between the p-type semiconductor film 2 and the n-type semiconductor film 3, because this junction surface is situated on the positive side of the p-type semiconductor (i.e. on the negative side of the n-type semiconductor).

On the other hand, heat is released at the junction surface 7a between the p-type semiconductor film 2 and the first electrode 4 and at the junction surface 7b between the n-type semiconductor film 3 and the second electrode 5, because these junction surfaces are situated respectively on the negative side of the p-type semiconductor and on the positive side of the n-type semiconductor. Thus, the areas near opposite side edges of the substrate 1 serve as heat-releasing portions 7a and 7b, and substantially the entire surface of the substrate 1 excluding those side-edge areas serves as a heat-absorbing portion 6. As a result, in the thermoelectric device 104 of this embodiment, as in the second embodiment, the substrate 1 as a whole provides heat-absorbing action. In addition, by adjusting the area and positions of the no-junction areas 6' in the heat-absorbing portion 6, it is possible to obtain the desired cooling capacity.

Figure 5A:
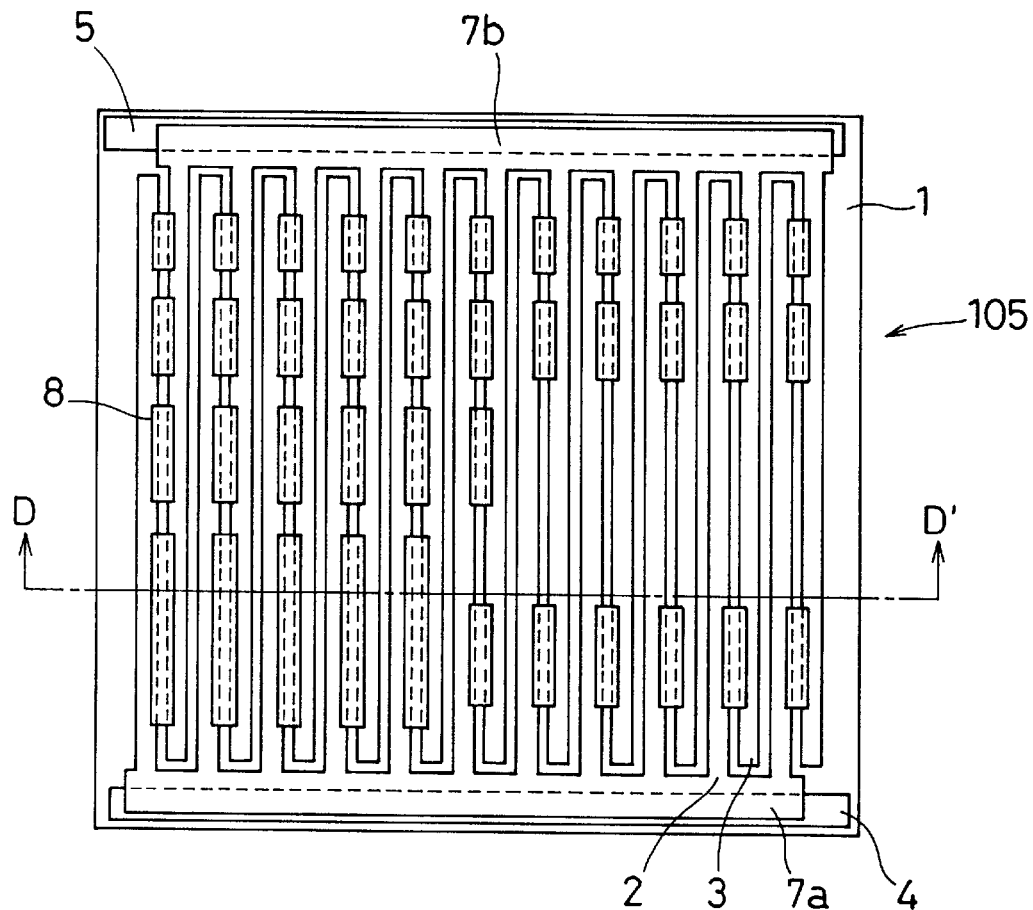
FIG. 5A is a plan view of the thermoelectric device of a fifth embodiment of the invention.
Figure 5B:
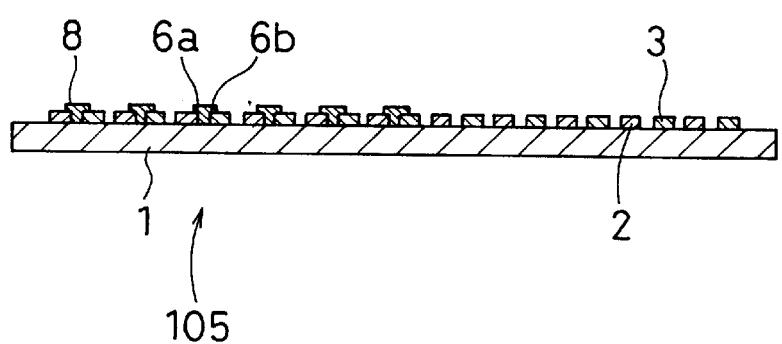
FIG. 5B is a section of the thermoelectric device of the fifth embodiment along line D-D' in FIG. 5A.

Next, a fifth embodiment will be described. FIG. 5A is a plan view of the thermoelectric device 105 of the fifth embodiment, and FIG. 5B is a section of this thermoelectric device 105 along line D-D' in FIG. 5A. In this embodiment, the substrate 1 and the electrodes 4 and 5 are constructed in the same manners as in the second embodiment. Specifically, on the top surface of the substrate 1, the first electrode 4 and the second electrode 5, both I-shaped, are formed along opposite side edges of the substrate 1.

The semiconductor films 2 and 3 are, as in the second embodiment, patterned in a comb-like shape, and connected respectively to the first and second electrodes 4 and 5. In this embodiment, however, the comb-tooth portions of the p-type semiconductor film 2 are formed well within the gaps between the comb-tooth portions of the n-type semiconductor film 3, and vice versa. As a result, these two semiconductor films 2 and 3 are not joined directly. Instead, these p-type and n-type semiconductor films 2 and 3 are electrically connected by conductive films 8 formed at appropriate positions over them. The conductive films 8 are made of electrical conducting material such as aluminum, silver, or gold.

When a direct-current voltage is applied across the thermoelectric device 105, with the first electrode 4 negative and the second electrode 5 positive, an electric current flows from the second electrode 5 through the n-type semiconductor film 3, then the conductive films 8, and then the p-type semiconductor film 2 to the first electrode 4. At this time, heat is absorbed at the junction surfaces 6a between the p-type semiconductor film 2 and the conductive films 8 and at the junction surfaces 6b between the n-type semiconductor film 3 and the conductive films 8, because these junction surfaces are situated respectively on the positive side of the p-type semiconductor and on the negative side of the n-type semiconductor.

On the other hand, heat is released at the junction surface 7a between the p-type semiconductor film 2 and the first electrode 4 and at the junction surface 7b between the n-type semiconductor film 3 and the second electrode 5, because these junction surfaces are situated respectively on the negative side of the p-type semi-conductor and on the positive side of the n-type semiconductor. Thus, the areas near opposite side edges of the substrate 1 serve as heat-releasing portions 7a and 7b, and substantially the entire surface of the substrate 1 excluding those side-edge areas serves as a heat-absorbing portion 6a and 6b. As a result, in the thermoelectric device 105 of this embodiment, as in the second embodiment, the substrate 1 as a whole provides heat-absorbing action. In addition, by adjusting the area and positions of the conductive films 8, it is possible to obtain the desired cooling capacity.

Figure 6A:
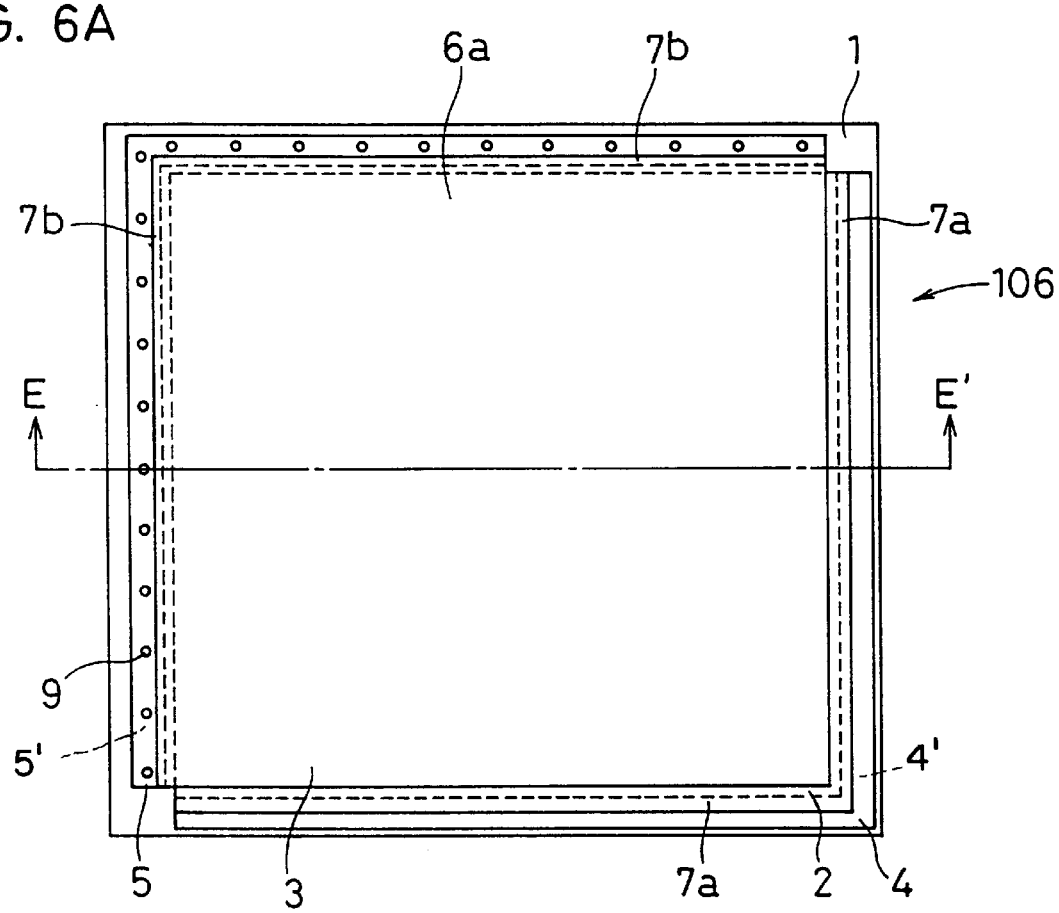
FIG. 6A is a plan view of the thermoelectric device of a sixth embodiment of the invention.
Figure 6B:
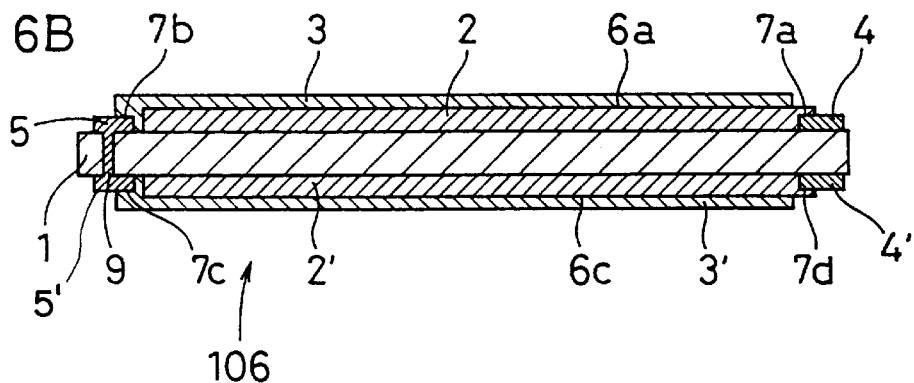
FIG. 6B is a section of the thermoelectric device of the sixth embodiment along line E-E' in FIG. 6A.

Next, a sixth embodiment will be described. FIG. 6A is a plan view of the thermoelectric device 106 of the sixth embodiment, and FIG. 6B is a section of this thermoelectric device 106 along line E-E' in FIG. 6A. In this embodiment, the substrate 1 is made of highly heat-insulating material such as foamed resin having a surface coating of ordinary resin, and a plurality of through holes 9 are formed along two adjacent side edges of this substrate 1.

In this embodiment, the semiconductor films 2, 2', 3, and 3', and the electrodes 4 and 4', 5 and 5' are made of the same materials and formed in the same manners as in the first embodiment. On both the top and bottom surfaces of the substrate 1, the first electrode 4 and 4' and the second electrode 5 and 5', both L-shaped, are formed along the side edges of the substrate 1. In particular, the second electrode 5 and 5' is, on both surfaces, so placed as to seal the through holes 9 so that its top-surface and bottom-surface portions are united through those through holes 9.

On both surfaces, the first electrode 4 and 4' is, at its top surface, connected to the p-type semiconductor film 2 and 2' formed in a substantially square shape, along its two adjacent side edges. The p-type semiconductor film 2 and 2' is placed apart from the second electrode 5 and 5'. Moreover, on both surfaces, the second electrode 5 and 5' is, at its top surface, connected to the n-type semiconductor film 3 and 3' formed in a substantially square shape, along its two adjacent side edges. The n-type semiconductor film 3 and 3' is placed apart from the first electrode 4 and 4'.

When a direct-current voltage is applied across the thermoelectric device 106, with the first electrode 4 on the top surface negative and the first electrode 4' on the bottom surface positive, an electric current flows, first on the bottom surface, from the first electrode 4' through the p-type semiconductor film 2' and then the n-type semiconductor film 3' to the second electrode 5'. Since the counterpart 5 of the second electrode 5' is placed in close contact with the n-type semiconductor film 3 on the top surface, the current then flows therefrom, on the top surface, through the p-type semiconductor film 2 to the first electrode 4.

At this time, heat is absorbed at the junction surface 6a between the p-type semiconductor film 2 and the n-type semiconductor film 3 on the top surface, at the junction surface 7c between the second electrode 5' and the n-type semiconductor film 3' on the bottom surface, and at the junction surface 7d between the p-type semiconductor film 2' and the first electrode 4' on the bottom surface, because these junction surfaces are each situated on the positive side of the p-type semiconductor (i.e. on the negative side of the n-type semiconductor).

On the other hand, heat is released at the junction surface 7a between the first electrode 4 and the p-type semiconductor film 2 on the top surface, at the junction surface 7b between the n-type semiconductor film 3 on the top surface and the second electrode 5. and at the junction surface 6c between the p-type semiconductor film 2' and the n-type semiconductor film 3' on the bottom surface, because these junction surfaces are each situated on the negative side of the p-type semiconductor (i.e. on the positive side of the n-type semiconductor). Thus, substantially the entire top surface of the substrate 1 excluding the side-edge areas serves as a heat-absorbing portion 6a, and substantially the entire bottom surface of the substrate 1 excluding the side-edge areas serves as a heat-releasing portion 6c.

As a result, in the thermoelectric device 106 of this embodiment, the substrate 1 provides heat-absorbing action on its entire top surface and heat-releasing action on its entire bottom surface. Here, the top surface, which absorbs heat, and the bottom surface, which releases heat, are separated by the highly heat-insulating substrate 1, and therefore loss of heat is suppressed to a minimum. Note that, although the thermoelectric device 106 of this embodiment is constructed on the basis of the thermoelectric device of the first embodiment, it is also possible to construct it on the basis of the fourth or fifth embodiment in which no-film areas or conductive films are formed in the semiconductor films 2, 2', 3, and 3'.

Figure 7A:
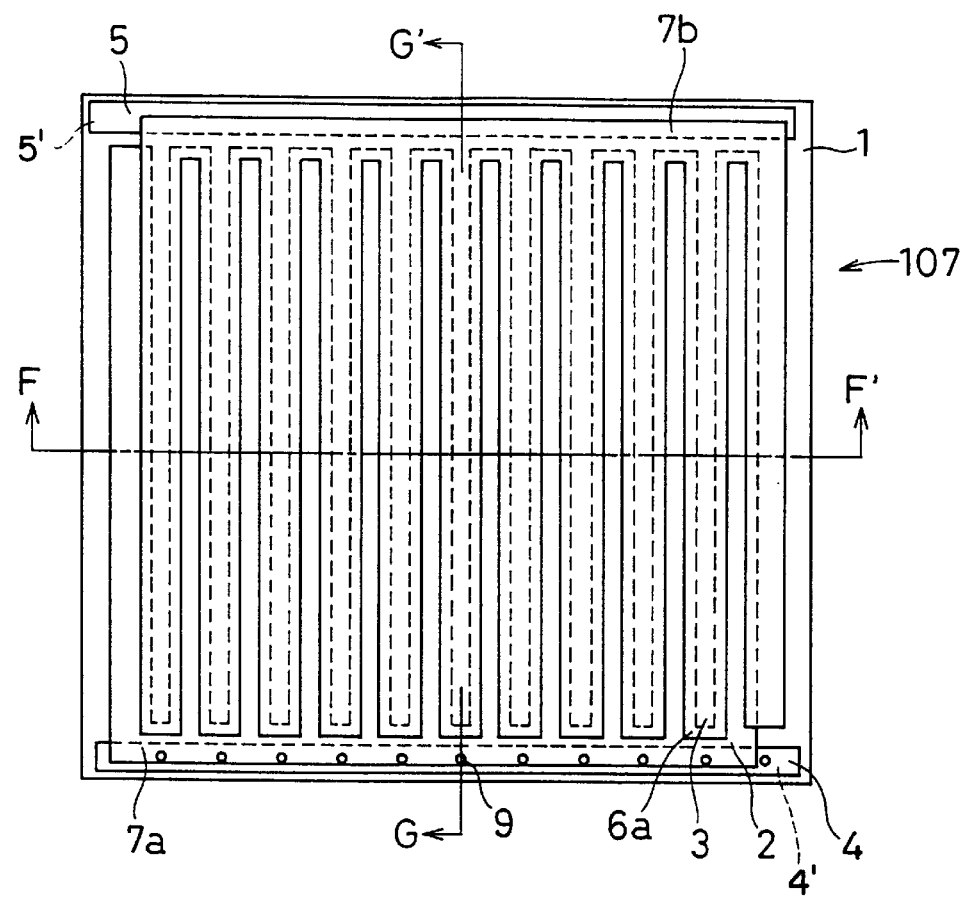
FIG. 7A is a plan view of the thermoelectric device of a seventh embodiment of the invention.
Figure 7B:
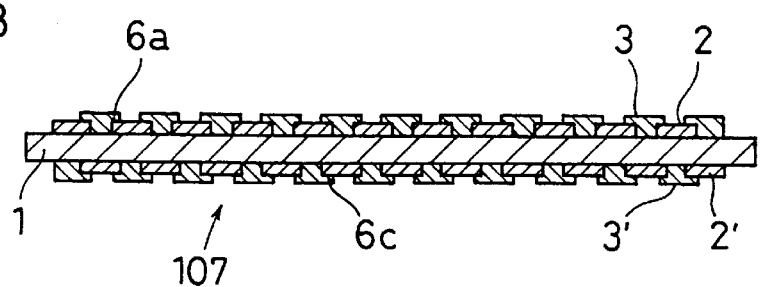
FIG. 7B is a section of the thermoelectric device of the seventh embodiment along line F-F' in FIG. 7A.
Figure 7C:
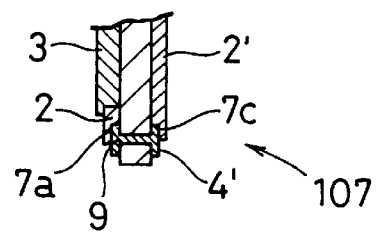
FIG. 7C is a part of a section of the thermoelectric device of the seventh embodiment along line G-G' in FIG. 7A.

Next, a seventh embodiment will be described. FIG. 7A is a plan view of the thermoelectric device 107 of the seventh embodiment, and FIG. 7B is a section of this thermoelectric device 107 along line F-F' in FIG. 7A. FIG. 7C is a part of a section of the same thermoelectric device 107 along line G-G' in FIG. 7A. In this embodiment, as in the sixth embodiment, the substrate 1 is made of highly heat-insulating material such as foamed resin having a surface coating of ordinary resin, and a plurality of through holes 9 are formed along two adjacent side edges of this substrate 1.

In this embodiment, the semiconductor films 2, 2', 3, and 3', and the electrodes 4, 4', 5, and 5' are made of the same materials and formed in the same manners as in the second embodiment. Specifically, on both the top and bottom surfaces of the substrate 1, the first electrode 4 and 4' and the second electrode 5 and 5', both I-shaped, are formed along opposite side edges of the substrate 1 (note that the electrodes 4' and 5' are situated below the electrodes 4 and 5 in FIG. 7A). In particular, the first electrode 4 and 4' is, on both surfaces, so placed as to seal the through holes 9 so that its top-surface and bottom-surface portions are united through those through holes 9.

On both surfaces, the first electrode 4 and 4' is, at its top surface, connected to the p-type semiconductor film 2 and 2' formed in a comb-like shape, along its comb-back portion. The p-type semiconductor film 2 and 2' is placed apart from the second electrode 5 and 5'. Moreover, on both surfaces, the second electrode 5 and 5' is, at its top surface, connected to the n-type semiconductor film 3 and 3' formed in a comb-like shape, along its comb-back portion. The n-type semiconductor film 3 and 3' is placed apart from the first electrode 4 and 4'. The p-type semiconductor films 2 and 2' and the n-type semiconductor films 3 and 3' are, as in the second embodiment, jointed together at the side edges of their comb-tooth portions. As a result, long, narrow junction surfaces 6a and 6c are formed over the entire top and bottom surfaces, respectively, of the substrate 1.

When a direct-current voltage is applied across the thermoelectric device 107, with the second electrode 5 on the top surface positive and the second electrode 5' on the bottom surface negative, an electric current flows, first on the top surface, from the second electrode 5 through the n-type semiconductor film 3 and then the p-type semiconductor film 2 to the first electrode 4. Since the counterpart 4 of the first electrode 4 is placed in close contact with the p-type semiconductor film 2' on the bottom surface, the current then flows therefrom, on the bottom surface, through the n-type semiconductor film 3' to the second electrode 5'.

At this time, heat is absorbed at the junction surface 6a between the p-type semiconductor film 2 and the n-type semiconductor film 3 on the top surface, at the junction surface between the second electrode 5' and the n-type semiconductor film 3' on the bottom surface, and at the junction surface 7c between the p-type semiconductor film 2' and the first electrode 4' on the bottom surface, because these junction surfaces are each situated on the positive side of the p-type semiconductor (i.e. on the negative side of the n-type semiconductor).

On the other hand, heat is released at the junction surface 7a between the first electrode 4 and the p-type semiconductor film 2 on the top surface, at the junction surface 7b between the n-type semiconductor film 3 and the second electrode 5 on the top surface, and at the junction surface 6c between the p-type semiconductor film 2' and the n-type semiconductor film 3' on the bottom surface, because these junction surfaces are each situated on the negative side of the p-type semiconductor (i.e. on the positive side of the n-type semiconductor). Thus, substantially the entire top surface of the substrate 1 excluding the opposite-side-edge areas serves as a heat-absorbing portion 6a, and substantially the entire bottom surface of the substrate 1 excluding the opposite-side-edge areas serves as a heat-releasing portion 6c.

As a result, in the thermoelectric device 107 of this embodiment, the substrate 1 provides heat-absorbing action on its entire top surface and heat-releasing action on its entire bottom surface. Note that, although the semiconductor films 2, 2', 3, and 3' are formed in a comb-like shape here, they may be shaped in any manner as long as the junction surfaces 6a and 6c are formed over substantially the entire top and bottom surfaces, respectively, of the substrate 1.

Figure 8:
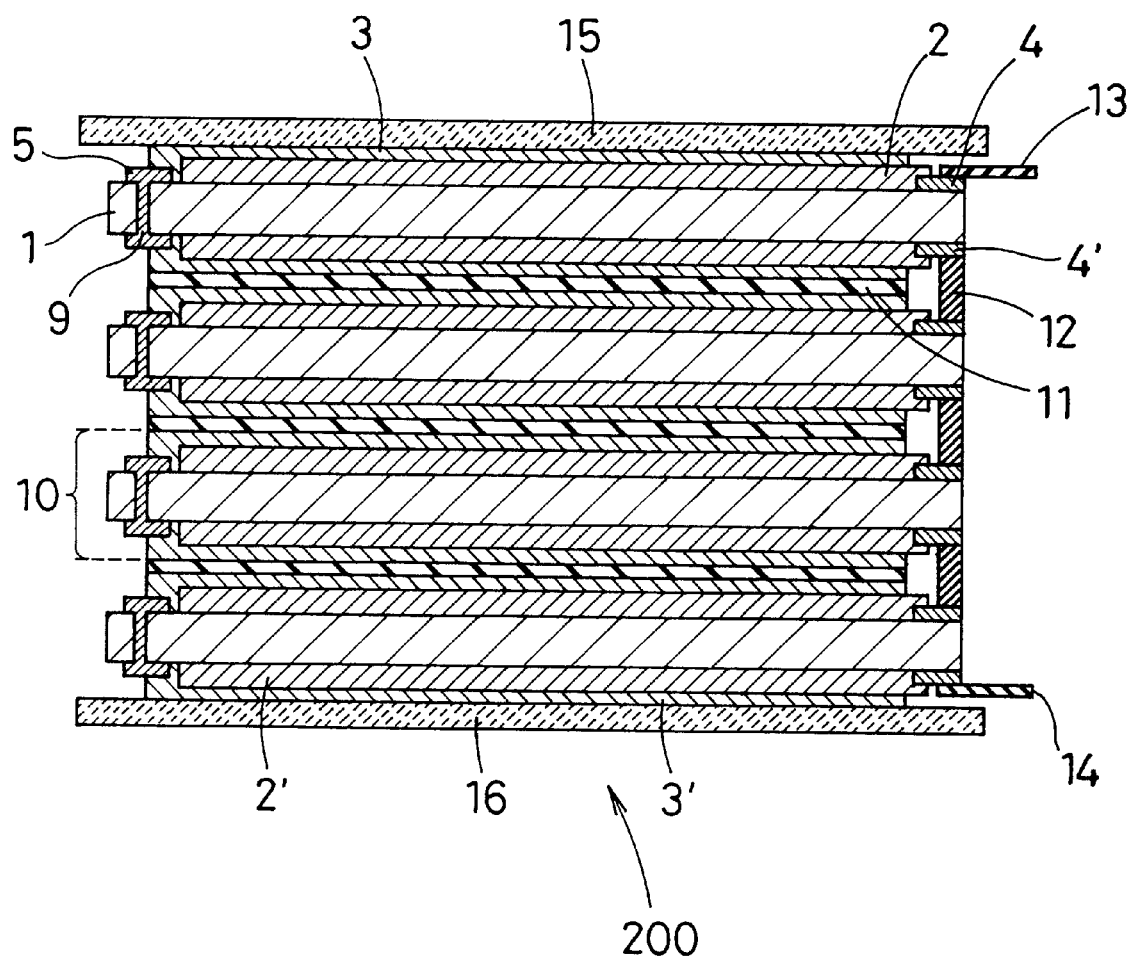
FIG. 8 is a vertical section of a thermoelectric module according to the invention.
Figure 9:
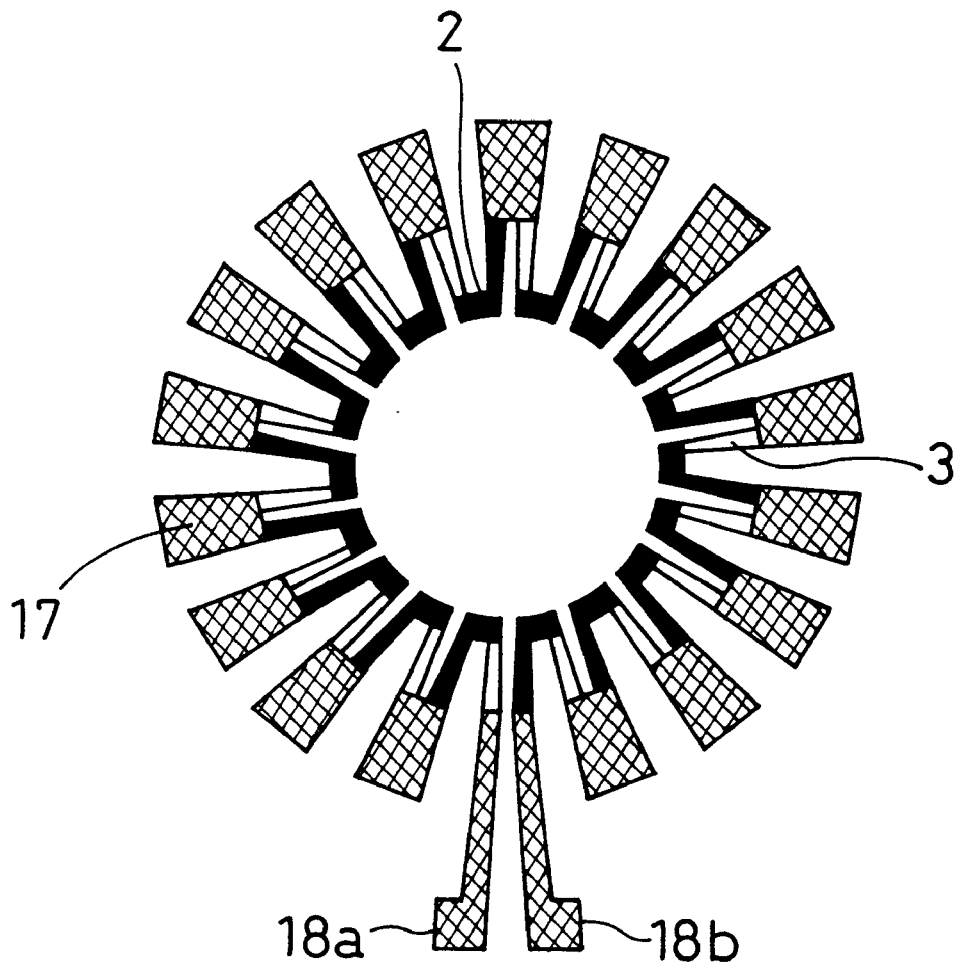
FIG. 9 is a plan view of a conventional film-type thermoelectric module.

Next, an embodiment of a thermoelectric module employing a thermoelectric device according to the present invention will be described. FIG. 8 is a vertical section of such a thermoelectric module 200. The thermoelectric module 200 of this embodiment is produced by laying over one another four of the thermoelectric device 106 (hereafter referred to simply as a unit 10) of the sixth embodiment, with unit-insulating elements 11 between them. The four units 10 are electrically connected in series by unit-connecting conductive elements 12 that connect the first electrode 4' on the bottom surface of one unit 10 to the first electrode 4 on the top surface of the unit 10 directly below it.

The first electrode 4 on the top surface of the topmost unit 10 and the first electrode 4' on the bottom surface of the bottommost unit 10 are fitted with module electrodes 13 and 14, respectively. The four units 10 are, as a whole, sandwiched between insulating plates 15 and 16 from above and from below.

When a direct-current voltage is applied across the thermoelectric module 200, with the module electrode 13 negative and the module electrode 14 positive, within each unit 10, as in the sixth embodiment, heat is absorbed at the junction surface between the p-type semiconductor film 2 and the n-type semiconductor film 3 on the top surface, and heat is released at the junction surface between the p-type semiconductor film 2' and the n-type semiconductor film 3' on the bottom surface, with the result that the entire top surface provides heat-absorbing action and the entire bottom surface provides heat-releasing action. Thus, in the module 200 as a whole, the upper insulating plate 15 serves as a heat-absorbing portion, and the lower insulating plate 16 serves as a heat-releasing portion.

Meanwhile, the unit-insulating elements 11, through heat conduction therethrough, serve to keep the temperature difference small between the heat-absorbing top surface of one unit 10 and the heat-releasing bottom surface of the unit 10 adjacent thereto across one of the unit-insulating elements 11. As a result, a gentle temperature gradient is obtained throughout the entire thermoelectric module 200 between its upper and lower insulating plates 15 and 16.

Thus, the thermoelectric module 200 of this embodiment can, at its heat-absorbing insulating plate 15, cool an object that has a large area. Although the current is passed from the module electrode 14 to the module electrode 13 here, it is also possible to pass the current in the reverse direction. In that case, heat is released at the upper insulating plate 15 and heat is absorbed at the lower insulating plate 16. Moreover, it is also possible, by producing a temperature difference between the upper and lower insulating plates 15 and 16, to generate electric power.

Although not shown in the figure, usually, a heat exchanger is attached to each of the insulating plates 15 and 16. This is to reduce the temperature difference between the insulating plates 15 and 16 by allowing them to exchange heat with ambient air through those heat exchangers. By reducing the temperature difference between the heat-absorbing insulating plate 15 and the heat-releasing insulating plate 16, it is possible to enhance the thermoelectric conversion efficiency of the thermoelectric module 200, and thus minimize the electric power required to keep one of the insulating plates at a fixed temperature.

Although this embodiment uses the thermoelectric device 106 of the sixth embodiment as the units 10, it is also possible to use the thermoelectric device 107 of the seventh embodiment as the units to be laid over one another, and use the thermoelectric device 103 or 104 of the third or fourth embodiment as the insulating plates 15 and 16.

As described above, according to the present invention, it is possible to realize a thermoelectric device that, despite using thermoelectric material in the form of films, can absorb or release heat over substantially the entire surface of its substrate, and thus, by use of such a thermoelectric device, it is possible to efficiently cool or heat an object that has a wide area, or make efficient use of an area when temperature is converted into electricity. Moreover, it is easy to adjust the cooling or heating capacity by adjusting the position, area, and number of junction surfaces between p-type and n-type semiconductor films and of conductive films connecting the two semiconductor films. In addition, it is also possible to realize a cascade-type thermoelectric module that, despite using thermoelectric material in the form of films, can efficiently produce a large temperature difference.

Obviously, many modifications and variations of the present invention are possible in light of the above teachings. It is therefore to be understood that within the scope of the appended claims, the invention may be practiced other than as specifically described.

What is claimed is:

1. A thermoelectric device for performing thermoelectric conversion in a wide-area thereof, comprising:
   a p-type semiconductor film;
   an n-type semiconductor film; and
   a substrate of electrical insulating material,
   wherein said p-type and n-type semiconductor films are formed so that one film substantially overlaps the other film, each of said overlapping films substantially covering the entire surface of the substrate, thereby providing a device which can perform thermoelectric conversion in a wide-area thereof.

2. A thermoelectric device as claimed in claim 1,
   wherein said p-type and n-type semiconductor films are joined so that a junction surface is formed between them.

3. A thermoelectric device as claimed in claim 2,
   wherein said junction surface extends uniformly over substantially the entire surface of said substrate.

4. A thermoelectric device as claimed in claim 2,
   wherein said junction surface extends non-uniformly over substantially the entire surface of said substrate.

5. A thermoelectric device as claimed in claim 4,
   wherein said junction surface is shaped like a strip and has substantially parallel sides.

6. A thermoelectric device as claimed in claim 4,
   wherein said junction surface is divided into a plurality of discrete portions.

7. A thermoelectric device as claimed in claim 1,
   wherein said p-type and n-type films are separated from each other and are connected to each other by a conductive film formed on their surfaces.

8. A thermoelectric device as claimed in claim 7,
   wherein said conductive film is divided into a plurality of discrete portions.

9. A thermoelectric device as claimed in claim 1,
   wherein said p-type and n-type films each have a plurality of strip portions corresponding thereto which are substantially parallel to one another,
   and wherein said strip portions corresponding to said p-type and n-type films are alternately formed on said substrate.

10. A thermoelectric device as claimed in claim 1,
    wherein a first electrode is formed in an area within the surface of said substrate where said n-type semiconductor film is not formed, with said p-type semiconductor film placed in contact with a surface of said first electrode, and
    wherein a second electrode is formed in an area within the surface of said substrate where said p-type semiconductor film is not formed, with said n-type semiconductor film placed in contact with a surface of said second electrode.

11. A thermoelectric device as claimed in claim 10,
    wherein said first and second electrodes are formed in a peripheral area on said substrate.

12. A thermoelectric device as claimed in claim 10,
    wherein said p-type and n-type semiconductor films are each divided into a plurality of discrete portions, with all the portions of said p-type semiconductor film placed in contact with said first electrode such that the former are electrically connected in parallel to the latter, and with all the portions of said n-type semiconductor film placed in contact with said second electrode such that the former are electrically connected in parallel to the latter.

13. A thermoelectric device as claimed in claim 1,
    wherein said p-type and n-type semiconductor films are formed both on a top surface and on a bottom surface of said substrate, with either the p-type or n-type semiconductor film on the top surface connected to the corresponding semiconductor film on the bottom surface by conductive material.

14. A thermoelectric device as claimed in claim 13,
    wherein said substrate has through holes, through which said conductive material is formed from the top surface of said substrate to the bottom surface thereof.

15. A thermoelectric device as claimed in claim 13,
    wherein said substrate is made of highly heat-insulating resin.

16. A thermoelectric module produced by laying a plurality of thermoelectric devices as claimed in claim 13 one over the other with electrical insulating material between them, wherein the n-type or p-type semiconductor films that are not connected by said conductive material in the individual thermoelectric devices are connected together by conductive material provided between the thermoelectric devices.

* * * * *